United States Patent [19]

Polinsky

[11] 3,961,358
[45] June 1, 1976

[54] LEAKAGE CURRENT PREVENTION IN SEMICONDUCTOR INTEGRATED CIRCUIT DEVICES

[75] Inventor: Murray Arthur Polinsky, Somerville, N.J.

[73] Assignee: RCA Corporation, New York, N.Y.

[22] Filed: Feb. 21, 1973

[21] Appl. No.: 334,431

[52] U.S. Cl. .................................. 357/53; 357/52
[51] Int. Cl.² ........................................ H01L 29/40
[58] Field of Search .............. 317/235 AH, 235 AG

[56] References Cited
UNITED STATES PATENTS

| | | | |
|---|---|---|---|
| 3,302,076 | 1/1967 | Kang et al. | 317/234 |
| 3,347,430 | 10/1967 | Pardue | 225/2 |
| 3,363,152 | 1/1968 | Lin | 317/235 |
| 3,423,606 | 1/1969 | Wanlass | 307/302 |
| 3,432,731 | 3/1969 | Whittier | 317/235 |
| 3,491,273 | 1/1970 | Stiegler | 317/235 |
| 3,600,648 | 8/1971 | Longo | 317/235 R |

OTHER PUBLICATIONS
H. Camenzind et al., "IC's Breakthrough the Voltage Barrier," Electronics, Mar. 31, 1969, pp. 90–95.

Primary Examiner—Andrew J. James
Assistant Examiner—Joseph E. Clawson, Jr.
Attorney, Agent, or Firm—H. Christoffersen; R. P. Williams

[57] ABSTRACT

Leakage currents can occur in monolithic semiconductor integrated circuits through field induced inversion layer channels where the field arises from a layer of distributed charge on the surface of the passivating insulator. These channels can occur at locations where adjacent conductors are at substantially different potentials during circuit operation. At those locations where such channels, if present, could couple a region in the device to another region which may be at some different potential, a conductor layer is disposed on the insulating layer. This conductor layer is adapted to be biased during operation of the device in such a way that an inversion layer channel is not induced thereunder, so that a continuous channel between the two regions cannot be established. Other locations where channels are not likely to occur are left free of conductive material in order to save space.

6 Claims, 4 Drawing Figures

U.S. Patent    June 1, 1976    3,961,358
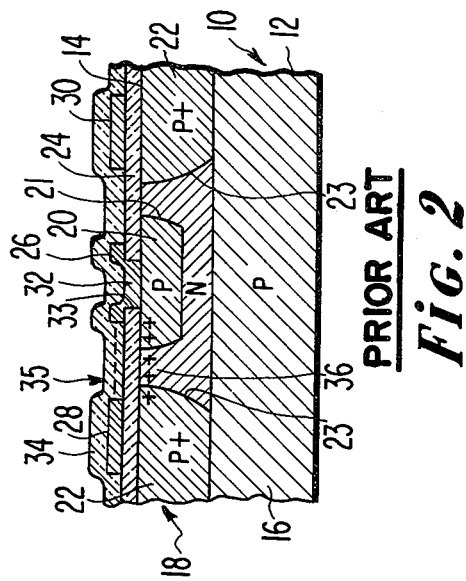
PRIOR ART
Fig. 2
Fig. 4
PRIOR ART
Fig. 1
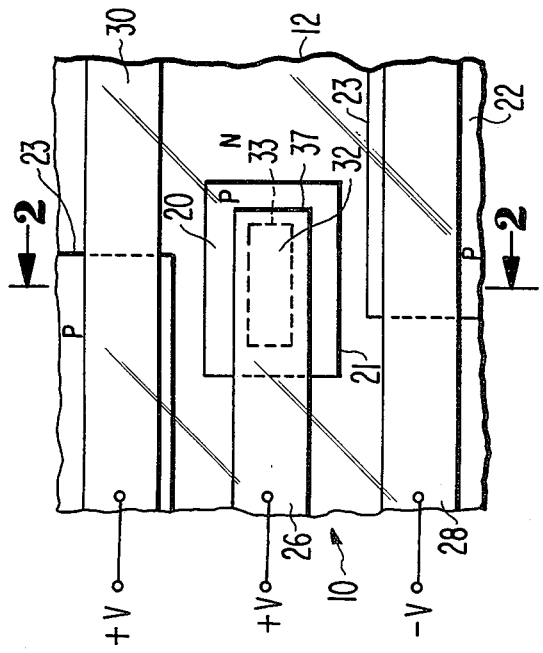
Fig. 3
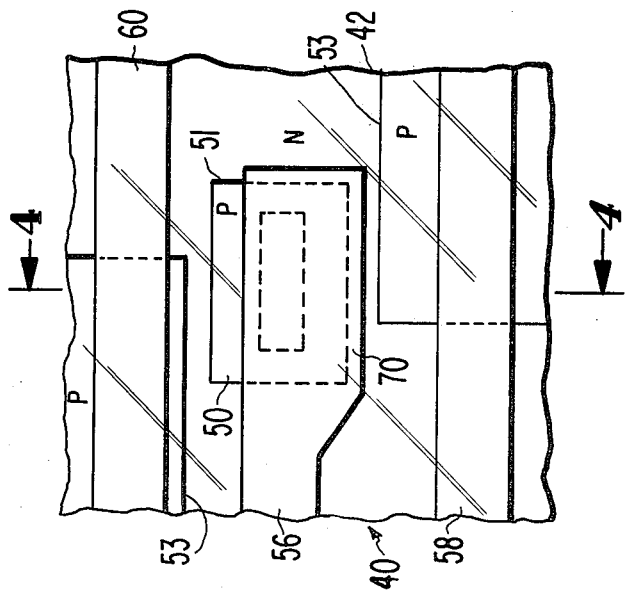

LEAKAGE CURRENT PREVENTION IN SEMICONDUCTOR INTEGRATED CIRCUIT DEVICES

The present invention pertains to semiconductor integrated circuit devices, particularly to those of the monolithic type.

A device of the type in which this invention finds utility includes a body of semiconductive material which has a planar surface adjacent to which there are regions which may constitute parts of active or passive circuit elements. These regions are bounded by PN junctions which extend to the planar surface of the device. The surface is covered with a coating of insulating material which serves to passivate the junctions and to provide a support for interconnection metallization layers, portions of which extend through openings in the insulating coating to contact desired areas of the surface.

It is known that inversion layer channels in these devices can provide current leakage paths between regions of the device which may be at different potentials. Several techniques are known for preventing these undesirable channels or for reducing their effects. Common techniques are (1) to employ a thick insulating coating so that the fields in the coating are small, (2) to provide a so-called guard band between the ends of a possible channel, or (3) to embed in the insulating coating a layer of conductive material which can act to shield the semiconductive material from field sources at the surface of the insulator. Each of these techniques is satisfactory but is limited in some way. For example, with a thick insulator, photolithographic processes cannot be performed with precision and thus manufacturing yields are often not sufficiently high. Both the channel-stopping guard band and the field shield techniques require substantial area and impose significant complications in the layout and/or in the manufacture of the devices in which they are used.

In discrete planar devices, it has been recognized that in the vicinity of PN junctions fringing fields can occur which may cause the accumulation of charge on the surface of the insulator over the junction and that these effects may be reduced by disposing conductors over the critical surface regions. See, for example, U.S. Patent 3,302,076 to Kang et al., which discloses that the contact to a region of a bipolar transistor should be extended onto the passivating insulator so that it overlies the junction intercept of the region. The equipotential surface provided by the extended portion of the contact prevents the accumulation of charge in the vicinity of the PN junction. This patent teaches that the entire surface intercept of the PN junction which bounds a given region should be covered by the equipotential surface, stating that any improvement will be found to be slight unless the junction is fully covered.

In the drawings:

FIG. 1 is a plan view of a portion of a typical prior art integrated circuit device.

FIG. 2 is a cross-section on the line 2—2 of of FIG. 1.

FIG. 3 is a plan view of a portion of an integrated circuit device having the channeling prevention means of the present invention incorporated therein.

FIG. 4 is a cross-section on the line 4—4 of FIG. 3.

FIGS. 1 and 2 illustrate some of the elements of a typical monolithic integrated circuit device 10 and illustrate a condition which can provide a detrimental inversion layer channel. As shown, the device 10 includes a body 12 of semiconductive material such as silicon which has a planar surface 14 adjacent to which there are regions which can be parts of active or passive circuit elements. The body 12 may consist of a substrate 16 of one type of conductivity, usually P type, having thereon an epitaxial layer 18 which is usually of N type material. Diffused regions 20 and 22, of P type conductivity, are in the epitaxial layer 18 and are bounded by PN junctions 21 and 23, respectively, which intercept the surface 14. The P type region 20 may be, for example, the anode of a diode and the regions 22 may be isolation regions.

A layer of insulating material 24, usually of silicon dioxide, is on the surface 14. Overlying the layer of insulating material 24 are strip-shaped conductor metallization layers 26, 28, and 30 which are interconnection conductors for the circuit elements. The conductor layer 26, for example, has a portion 32 thereof extending through an opening 33 in the insulating layer 24 to make contact to the region 20. The conductor layers 28 and 30 serve to interconnect elements which are not shown. These conductors are in nonsurrounding relation to the region 20. A protective glass or silicon dioxide coating 34 may overlie the entire top surface of the device.

In many circuit applications, adjacent ones of the interconnection conductors are at substantially different potentials during operation of the device. As illustrated diagrammatically in FIG. 1, the conductor layer 28 may be at a substantially lower voltage, designated −V volts, than the conductor layer 26. The conductor layer 30 is shown as having +V volts applied thereto so that it is at substantially the same potential as the conductor layer 26.

The phenomenon of leakage through inversion layer channels in devices of this kind has been known for some time. The channels are usually thought of as being caused by electric fields which originate in the conductors of the device. Thus, if the conductor layer 28 is at sufficiently low potential with respect to the semiconductive material therebeneath, it will act to deplete the surface area of the semiconductor of electrons and enhance the density of holes, if conditions in nearby regions allow, i.e., if there is a nearby source of holes, to provide a P type channel. Care is usually taken to route metallization of this kind so that it does not cross any P type regions between which leakage would be detrimental.

There is also another source of an inverting field which does not underlie the interconnection metallization. I have found that in integrated circuit devices, where adjacent conductors are at relatively different potentials during circuit operation, charge can leak off one of the conductors and spread across the surface of the insulating coating 24, or at the interface between the insulating coating 24 and the protective coating 34 when the latter coating is present, under the influence of the lateral electric field between the two conductors. After some time of operation and depending on the temperature of the device and the potential difference between the two conductors, enough charge can leak off a conductor over a finite area to act as a field plate and induce an inversion layer channel in the semiconductor body therebeneath. If that finite area overlies two P type regions, they will be linked together by the inversion layer channel and leakage between them can then take place if they happen to be at different potentials.

The cross-section of FIG. 2 diagrammatically illustrates such a leakage condition. As shown, there may be a zone 35 which lies between the conductor layers 28 and 26 where electrons from the conductor layer 28 may reside on the surface of the insulator layer 24. When enough electrons are present, an inversion layer in the region 36 of the body 12 beneath the zone 35 will occur, and the region 20 will be conductively joined thereby to the region 22. The area over which charge will migrate lies substantially between the conductor layers 26 and 28. Beyond the terminal end 37 of the conductor layer 26, the lateral electric field between the two conductors will taper off with the result that the surface charge density will diminish to the point that no inversion layer is induced.

Since the conductor layers 26 and 30 are at substantially the same potential in this example, there will be little or no lateral electric field between them, and there is therefore little likelihood of a charge layer building up between them. This is not to say that there may not be some mobile charge on the insulating layer between these conductors, but such charge will usually not be present in enough quantity to result in an inversion layer channel.

FIGS. 3 and 4 illustrate a preferred solution to this problem. As shown, there is an integrated circuit device 40 which includes a semiconductor body 42 having a surface 44 corresponding to the body 12 and surface 14 of the device 10. Similarly, there is a substrate 46, an epitaxial layer 48, regions 50 and 52, junctions 51 and 53, an insulating layer 54, strip-shaped conductor layers 56, 58, 60, and a protective coating 64, all corresponding to the similar elements in the prior art structure. In the present novel structure, however, a conductor layer 70 is disposed over the insulating layer 54 over a portion of the finite area thereof adjacent to the PN junction 51, where charge could otherwise reside. In the operation of the device, this conductor layer 70 is arranged to be biased with respect to the region 50 and the underlying N type material so as to prevent the induction of an inversion layer of holes in the N type material adjacent to the region 50.

Preferably, the conductor layer 70 is a portion of the conductor layer 56, as shown, in order to save space. When this is the case, no channel can be induced in the region adjacent to the junction 51 because, if a channel were present, it would be at or near the potential of the region 50. The conductor layer 70 is necessarily at the same potential; consequently, no inducing field can exist and hence, no channel can exist. Moreover, in the example shown, the region 52 is an isolation region and would normally be biased at the lowest potential available in the circuit. Under these circumstances, the region 52 cannot supply holes for an inversion layer and, since the region 50 is also prevented by the conductor layer 70, from being a source for holes, there can be no channel at all in the zone between the regions 50 and 52. Generally, the conductor layer 70 should be disposed adjacent to that one of two differently biased regions which during operation would be the source of the carriers needed to form an inversion layer between the two regions, that is, the more positively biased of two P type regions or the more negatively biased of two N type regions.

Where the conductor layer is not directly connected to the region 50, it must always be at a potential, during operation of the device, which is below the inversion threshold potential across the insulating layer 54. The threshold voltage will vary depending on the conditions in the device near the area of interest, but a suitable value of threshold voltage can usually be determined from, for example, the formulae for inversion under non-equilibrium conditions given at page 288 of Grove, "Physics and Technology of Semiconductor Devices," John Wiley and Sons, Inc., N.Y., 1967 (Library of Congress Catalog Card No. 67-17340). The bias voltage on the conductor layer 70 may then be set at some safe level with respect to the threshold voltage thus determined.

The precise geometry of the conductor layer 70 is not critical. Care should be taken, however, to insure that it overlies those finite areas of the insulating layer where charge build-up is likely to occur. In other words, in the example shown, conductor layer 56 should be extended to form the conductor layer 70 toward the conductor layer 58 from which charge can leak so that the conductor layer 70 is on that portion of the insulation layer which lies between the PN junction 51 and the conductor layer 58. The conductor layer 70 should be extended somewhat beyond the areas described here into the areas of the weaker fringing lateral fields, but it should not extend over areas where charge build-up is not likely to occur. The design rules for integrated circuit devices usually specify a minimum distance of separation between adjacent conductors. If, for example, the distance between the conductors illustrated in the drawings is the minimum distance, then the extension of the conductor layer 56 to form the conductor layer 70 would require that the conductor layer 58 be located further away from the region 50 than the conductor layer 28 is displaced from the region 20 in the prior art structure of FIGS. 1 and 2. Thus there is a sacrifice in useable area which results from the use of the present invention.

Because of this sacrifice in area, care should be taken by the layout designer to limit the use of the channel stopping conductors to only those locations where the channeling problem is likely to occur. In the example illustrated, the conductor 70 does not overlie any substantial portion of the surface of the insulator layer 54 which lies between the conductor layer 56 and the conductor layer 60. Consequently, the location of the conductor 60 with respect to the region 50 may be the same as in the prior art structure 10, with a resultant saving of space.

What is claimed is:

1. In a semiconductor integrated circuit device of the type which includes a body of semiconductive material having a surface, regions in said body bounded by PN junctions extending to said surface, a layer of insulating material on said surface, and conductors overlying said layer of insulating material, said conductors, during operation of said device, being at different potentials whereby charge can leak off a conductor and spread over a finite area of said layer of insulating material to act as a field plate to induce an inversion layer channel in said body therebeneath, the improvement comprising:

a conductor layer on said insulating layer over a portion of the finite area of said insulating layer which lies between one of said PN junctions and a conductor from which charge can leak, for preventing such a field induced inversion layer channel from extending into contact with one of said PN junctions, portions of said insulating layer which do not lie between said PN junction and a conductor from which charge can leak having no conductor layer thereon.

2. The improvement defined in claim 1 in which there are a plurality of said finite areas, and in which there is a conductor layer on said insulating layer over a portion of each of said finite areas.

3. The improvement defined in claim 1 wherein said body has P type regions in N type material, said conductor layer overlying said N type material adjacent to a P type region.

4. The improvement defined in claim 3 wherein said conductor layer is adapted to be coupled to a source of potential during operation of said device.

5. The improvement defined in claim 3 wherein said conductor layer is a portion of a conductor layer which extends into ohmic contact with the adjacent P type region.

6. The improvement defined in claim 5 wherein said conductor layer extends over a portion only of the surface intercept of the PN junction bounding said region.

* * * * *